United States Patent [19]

Dipoala

[11] Patent Number: 5,216,388
[45] Date of Patent: Jun. 1, 1993

[54] MICROWAVE OSCILLATOR WITH TEMPERATURE COMPENSATION

[75] Inventor: William S. Dipoala, Fairport, N.Y.

[73] Assignee: Detection Systems, Inc., Fairport, N.Y.

[21] Appl. No.: 789,937

[22] Filed: Nov. 12, 1991

[51] Int. Cl.$^5$ .............................................. H03B 1/00
[52] U.S. Cl. ...................................... 331/96; 333/232
[58] Field of Search .................. 331/96; 333/219, 227, 333/229, 231, 232, 234

[56] References Cited

U.S. PATENT DOCUMENTS 4,019,161  4/1977  Kimura et al. ..................... 331/96 X Primary Examiner—Robert J. Pascal
Attorney, Agent, or Firm—Warren W. Kurz

[57] ABSTRACT

A microwave oscillator includes a metal housing which defines a cavity in which microwave radiation is produced by an internally mounted Gunn diode or the like. A tuning member projects into the microwave cavity through a hole formed in a wall of the oscillator housing. Depending on the length of its projection into the cavity, the tuning member controls the frequency of the microwave energy produced by the oscillator. The tuning member is supported on the cavity housing by a mounting member made from a material having a relatively high coefficient of thermal expansion. Particularly preferred materials include polymers such as polyethylene and polypropylene. Preferably, a microwave filter or choke is provided to reduce the leakage of microwave energy from the cavity through the hole in the oscillator housing. Such a choke comprises a pair of capacitors separated by an inductor. These elements are defined by (a) a portion of the oscillator housing, (b) the tuning screw (which is given a special cross-sectional contour), and (c) a sleeve of dielectric material, such as Teflon, which surrounds the tuning member.

19 Claims, 1 Drawing Sheet

MICROWAVE OSCILLATOR WITH TEMPERATURE COMPENSATION

BACKGROUND OF THE INVENTION

The present invention relates to improvements in temperature-compensated microwave oscillators of the type used, for example, in Doppler-based motion-detection systems.

It is well known that the frequency of oscillation of a microwave oscillator is temperature-dependent. Left uncompensated for ambient temperature changes, the output frequency of a conventional X-band Gunn oscillator can vary by as much as 800 kHz.per degree-Centrigrade. This variation is primarily the result of metal expansion of the oscillator's metal housing which defines the resonant cavity. As the ambient temperature increases, the cavity expands in size, causing a corresponding decrease in the cavity's resonant frequency.

Due to FCC requirements governing acceptable frequency bandpasses within which certain types of microwave oscillators can operate, it is common for manufacturers of such oscillators to incorporate some means for compensating for ambient temperature changes so that the output frequency remains substantially stable with temperature. A common technique is one which exploits a differential metal expansion between the oscillator's metal housing and a so-called "tuning rod" which extends into the cavity as a stub. In general, the further the tuning rod extends into the cavity, the lower the frequency of oscillation. The rod is mounted at one end of a tube extending outwardly from the oscillator housing. Thus, as the temperature increases, the cavity becomes larger and the resonant frequency drops. But at the same time, the tube grows in length, thereby withdrawing the tuning rod from the cavity and causing the resonant frequency to increase. In theory, by properly selecting the materials of the housing and the tuning rod, the frequency drop caused by the growth of the cavity will be offset by the frequency increase caused by the partial extraction of the tuning rod from the cavity, and the oscillator frequency will remain constant with temperature. While it is never possible to entirely eliminate frequency drift, it is possible to reduce the frequency drift to less than 50 kHz per degree Centigrade.

In the differential expansion scheme described above, it is common to select a tuning rod material which exhibits very little expansion with temperature. Otherwise, the length of the tube in which the tuning rod is mounted need be relatively long in order to achieve the desired movement (as a result of temperature change) of the free end of the rod in the cavity. A preferred material is alumina. The use of such materials can add significantly to the product cost and, desirably, should be avoided.

SUMMARY OF THE INVENTION

In view of the foregoing discussion, an object of this invention is to provide a lower-cost scheme for achieving temperature compensation in a microwave oscillator.

According to a preferred embodiment of the invention, the above object is achieved by a microwave oscillator which comprises the combination of the following elements: (a) a housing which defines a cavity in which microwave radiation is produced by an internally mounted source of microwave energy; (b) a tuning member projecting into the microwave cavity through a hole formed in a wall of the housing, the length of the projection of such member into the cavity determining, in part, the frequency of the microwave energy produced by the oscillator; and (c) a tubular support member mounted on and extending outwardly from the housing for supporting the tuning member by one end in a position such that such tuning member projects through the hole and into the cavity, such support member and such housing being comprised of different materials having substantially different coefficients of thermal expansion.

According to a particularly preferred embodiment, the housing is made of zinc, the tuning member is made of steel, and the support member is made of polyethylene. To prevent microwave energy from leaking from the cavity through the hole in the housing, a microwave filter is provided in the hole.

The invention and its various advantages will be better understood from the ensuing detaile description of a preferred embodiment, reference being made to the accompanying drawings, wherein like reference characters represent like parts.

DETAILED DESCRIPTION OF PREFERRED EMBODIMENTS

Figure 1:
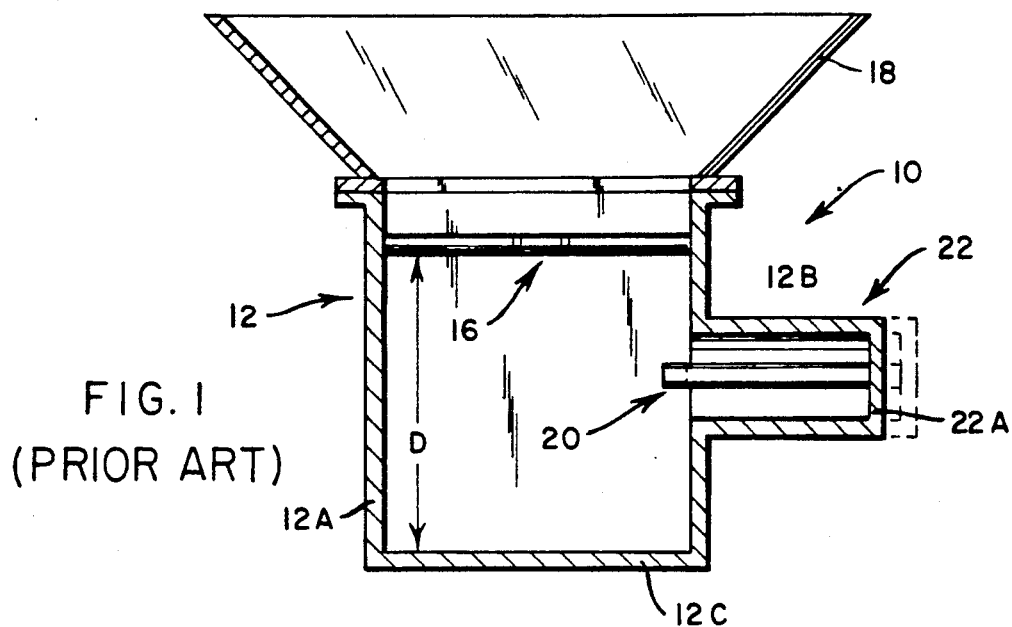
FIG. 1 is a schematic cross-sectional illustration of a prior art temperature-compensated microwave oscillator.

Referring now to the drawings, FIG. 1 schematically illustrates a conventional Gunn oscillator 10 comprising a metal housing 12 which defines a cavity 14. A Gunn diode 16 is supported within the cavity between the side walls 12A and 12B of the housing. When energized with electrical current, diode 16 produces microwave energy which is broadcast into space by an antenna or horn 18. The frequency of this energy is determined by several parameters, including the size and shape of the cavity. As the ambient temperature changes, the metal housing increases or decreases in size, and the distance D between the diode and the back wall 12C of the housing changes. The shorter the distance D, the higher the frequency of oscillation, and vice versa. A tuning rod 20 is supported at one end 20A by the end wall 22A of a chimney 22 which is integral with housing wall 12B. Member 20 is commonly provided with threads which mate with threads in end wall 22A so that, by rotating member 20 about its longitudinal axis, the lateral position of the free end 20A of member 20 can be adjusted. The extent to which member 20 projects into the cavity determines the final resonant frequency of the oscillator, the further in, the lower the frequency. Usually, the nominal distance D is chosen to produce a frequency about 10% higher than the desired frequency, and the final frequency is adjusted downward by adjusting the position of the tuning member.

In the FIG. 1 device, housing 12 is usually made of aluminum, zinc or copper, and the tuning member is made of some material, usually alumina, having a lower coefficient of thermal expansion. Thus, it will be appreciated that, as the temperature increases and chimney 22 increases in length, end wall 22A tends to extract the tuning member from the cavity, assuming member 20 grows in length at a lesser rate with increased temperature than does the chimney. Since an increase in D has the effect of lowering the resonant frequency, and an increase in the length of the chimney has the effect of increasing the frequency, the temperature-compensating effect on frequency is apparent. The effectiveness of this temperature-compensation scheme is largely dependent on selecting the right materials, and the material of the tuning rod is usually dictated by the material of housing 12.

Now in accordance with the present invention, the above-mentioned dependency is eliminated by forming chimney 22 from a material other than that of the oscillator housing, preferably from a material having a coefficient of thermal expansion substantially greater than those of conventional housing metals. By using a material such as polyethylene, which has a thermal coefficient about six times that of zinc, and twenty times that of steel, a low-cost tuning member, such as a steel screw, can be used to provide a low-cost and physically compact solution to temperature compensation.

Figures 2, 3:
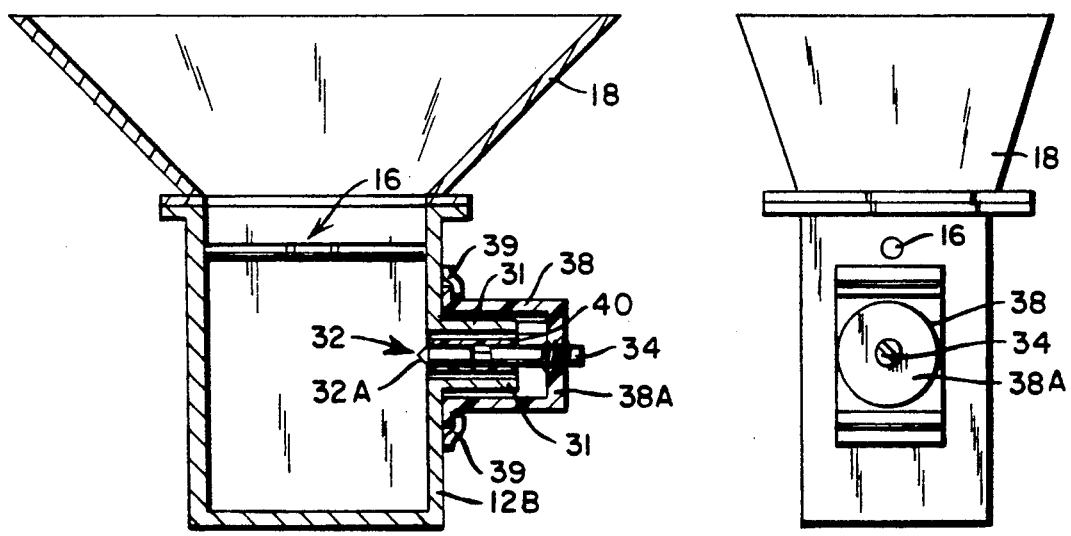
FIG. 2 is a cross-sectional illustration of a temperature-compensated microwave oscillator embodying the present invention.
FIG. 3 is a side elevation of the FIG. 2 apparatus.
Figure 4:
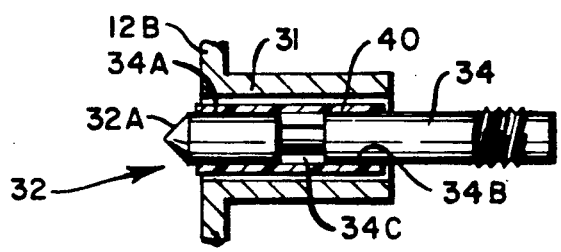
FIG. 4 is an enlarged view of a portion of the FIG. 2 apparatus.

Referring to the microwave oscillator shown in FIG. 2, housing wall 12B is provided with a circular hole 30 which is surrounded by a circular flange 31 extending outwardly from the wall. A tuning member 32 projects through hole 30 and its tip 32A extends into the cavity to control the resonant frequency thereof. The tuning member 32 is in the form of a shaped screw 34 having two cylindrical portions 34A and 34B which are spaced apart by a third cylindrical portion 34C of substantially reduced diameter. (See FIG. 4). One end of tuning screw 34 is provided with threads 36 which mate with threads formed in an end wall 38A of a non-integral chimney member 38. The latter is connected to the housing wall 12B by a pair of metal clips 39. In response to ambient temperature changes, the length of chimney 38 undergoes a change, thereby causing the tuning screw to move in or out of the cavity, depending on the direction of the temperature change. Because of the high thermal coefficient of polyethylene, a relative short chimney can be used, such as one having a length L of about 1.5 centimeters, assuming a steel tuning element. The amount of compensation, of course, is determined by the length of the chimney.

Since the tuning screw must be allowed to move freely within hole 30, there is a possibility for some leakage of energy from the cavity through this hole, causing an undesirable side lobe. If this leakage is too large, the microwave cavity can become unstable. According to a preferred embodiment, this potential leakage is minimized by the provision of a microwave choke or filter positioned within the housing wall. Such a choke is provided by a pair of capacitors having an inductive member therebetween. These elements are provided by shaping the tuning screw as shown (and described above) and placing a sleeve 40 of a dielectric material (e.g. Teflon) about the tuning screw. The capacitors are defined by the larger cylindrical portions 34A and 34B, flange 31 and the intervening dielectric material of sleeve 40. The inductive element is provided by the region 34C of the tuning screw which also cooperates with flange 31. This C,L,C filter has proven very effective minimizing leakage.

From the foregoing description, it will be appreciated that a low-cost solution to temperature compensation in a microwave oscillator has been provided. By using a chimney made of a material having a high coefficient of thermal expansion, the length of the tuning screw-supporting chimney can be shortened, thereby providing a more compact structure, and a low-cost tuning element can be used. As mentioned, a particularly preferred embodiment comprises a cast zinc housing with a polyethylene chimney and a steel tuning screw. Such a device has been built, tested and demonstrated to exhibit a temperature compensation of 150 kHz per degree Centigrade, well within FCC requirements.

While the invention has been disclosed with reference to a preferred embodiment, it will be apparent that variations can be made without departing from the spirit of the invention. For example, while polyethylene is the most preferred chimney material, other polymeric materials (e.g. polystyrene and polypropylene) which have a thermal coeffecient substantially greater than conventional housing metals can also be used.

What is claimed is:

1. A microwave oscillator comprising a housing which defines a cavity in which microwave radiation is produced by an internally mounted source of microwave energy, a tuning screw projecting into the microwave cavity through a hole formed in a wall of said housing, the length of the projection of said screw into the cavity determining, in part, the frequency of the microwave energy produced by said oscillator, a threaded support member mounted on said housing for supporting said screw in a position such that said screw projects through said hole and into said cavity, said support member and said housing being comprised of different materials having substantially different coeffecients of thermal expansion, and a microwave filter for reducing the leakage of microwave energy from said cavity through said hole in the microwave housing.

2. The microwave oscillator as defined by claim 1 wherein said housing comprises a metal, and wherein said support member comprises a plastic.

3. The microwave oscillator as defined by claim 2 wherein said plastic is polyethylene.

4. The microwave oscillator as defined by claim 3 wherein said metal comprises zinc.

5. The microwave oscillator as defined by claim 1 wherein said filter comprises a pair of capacitors separated by an inductor concentrically arranged with respect to said hole.

6. The microwave oscillator as defined by claim 5 wherein said capacitors and inductor are defined by (a) a portion of the oscillator housing, (b) the tuning screw, and (c) a sleeve of dielectric material, which surrounds the tuning screw.

7. A microwave oscillator comprising a zinc housing which defines a cavity in which microwave radiation is produced by an internally mounted Gunn diode, a tuning member projecting into the microwave cavity through a hole formed in a wall of said housing, the length of the projection of said member into the cavity determining, in part, the frequency of the microwave energy produced by said oscillator, a support member mounted on said housing for supporting said screw in a fixed position such that said member projects a predetermined fixed distance through said hole and into said cavity, said support member and said housing being comprised of different materials having substantially different coeffecients of thermal expansion, and a microwave filter for reducing the leakage of microwave energy from said cavity through said hole in the microwave housing.

8. The microwave oscillator as defined by claim 7, wherein said housing and tuning member comprise a metal, and wherein said support member comprises a plastic.

9. The microwave oscillator as defined by claim 8 wherein said plastic is polyethylene 10. The microwave oscillator as defined by claim 8 wherein the metal of said housing comprises zinc, and the metal of said tuning member comprises steel.

11. The microwave oscillator as defined by claim 7 wherein said filter comprises a pair of capacitors separated by an inductor concentrically arranged with respect to said hole.

12. The microwave oscillator as defined by claim 11 wherein said capacitors and inductor are defined by (a) a portion of the oscillator housing, (b) the tuning screw, and (c) a sleeve of dielectric material, which surrounds the tuning screw.

13. The microwave oscillator as defined by 7 wherein said tuning member is threaded into said support member.

14. A microwave oscillator comprising: (a) a housing which defines a resonant cavity in which microwave radiation is producible by an internally mounted source of microwave energy; (b) a tuning member projecting into said resonant cavity through a hole in a wall of said housing; (c) a tubular support member mounted on and extending outwardly from said housing wall for supporting said tuning member by one end in a position such that said tuning member projects through said hole and into said cavity, said tubular support member being comprised of a plastic and said housing being comprised of a metal; and (d) a microwave filter for reducing any leakage of microwave energy from said cavity through said hole.

15. The microwave oscillator as defined by claim 14 wherein said metal is zinc, and said plastic is polyethylene.

16. The microwave oscillator as defined by claim 15 wherein said tuning member comprises steel.

17. The microwave oscillator as defined by claim 14 wherein said tuning member is threaded into said support, whereby the distance said member projects into said cavity is adjustable by rotating said member about its longitudinal axis.

18. A microwave oscillator comprising: (a) a housing which defines a resonant cavity in which microwave radiation is producible by an internally mounted source of microwave energy; (b) a cylindrically-shaped tuning member projecting into said resonant cavity through a circular hole in a wall of said housing, said hole having a diameter slightly larger than the diameter of said cylindrically-shaped tuning member; and (c) a support member mounted on and extending outwardly from said housing wall toward the exterior of said cavity for supporting said tuning member by one end in a position such that said tuning member projects through said hole and into said cavity, said support member and said housing being comprised of materials having substantially different coefficients of thermal expansion.

19. The microwave oscillator as defined by claim 18 wherein said one end of said tuning member is threaded into said support member, whereby the distance said tuning member projects into said cavity is adjustable.

* * * * *